United States Patent
Jin et al.

(10) Patent No.: US 7,193,895 B2
(45) Date of Patent: Mar. 20, 2007

(54) REDUNDANT MEMORY CONTENT SUBSTITUTION APPARATUS AND METHOD

(75) Inventors: Kyoung-Chon Jin, San Ramon, CA (US); Shiou-Yu Alex Wang, Cupertino, CA (US); Ker-Ching Liu, Palo Alto, CA (US)

(73) Assignee: Chingis Technology Corporation, San Jose, CA (US)

( * ) Notice: Subject to any disclaimer, the term of this patent is extended or adjusted under 35 U.S.C. 154(b) by 60 days.

(21) Appl. No.: 11/165,977

(22) Filed: Jun. 24, 2005

(65) Prior Publication Data

US 2006/0291283 A1    Dec. 28, 2006

(51) Int. Cl.
G11C 11/34    (2006.01)
(52) U.S. Cl. .................................. 365/185.09; 365/200
(58) Field of Classification Search ........... 365/185.09, 365/200
See application file for complete search history.

(56) References Cited

U.S. PATENT DOCUMENTS

| | | | | |
|---|---|---|---|---|
| 5,502,676 A | * | 3/1996 | Pelley et al. ................. | 365/200 |
| 5,774,396 A | * | 6/1998 | Lee et al. ............... | 365/185.09 |
| 6,307,787 B1 | * | 10/2001 | Al-Shamma et al. .. | 365/185.33 |
| 6,614,685 B2 | * | 9/2003 | Wong ..................... | 365/185.11 |
| 7,079,431 B2 | * | 7/2006 | Kock et al. .................. | 365/200 |

* cited by examiner

Primary Examiner—Tuan T. Nguyen
Assistant Examiner—Alexander Sofocleous
(74) Attorney, Agent, or Firm—MacPherson Kwok Chen & Heid LLP; Clifford G. Cousins

(57) ABSTRACT

A memory apparatus includes a main memory, a redundant memory, and a substitution control unit. The main memory is configured to receive a read address and output a main data word comprising a plurality of main data sub-words where the read address includes a first portion and a second portion. The redundant memory is configured to receive the read address first portion and output a redundant data sub-word. The substitution control unit includes a substitution control word memory configured to store a plurality of substitution control words and configured to receive the read address first portion and assert a substitution control word including a substitution address second portion. The read address first portion and substitution address second portion form a substitution address. The substitution control unit asserts a substitution control signal when there is a match between the read address and the substitution address.

20 Claims, 6 Drawing Sheets

REDUNDANT MEMORY CONTENT SUBSTITUTION APPARATUS AND METHOD

FIELD OF INVENTION

This invention relates generally to memory content access, and more particularly to a redundant memory content substitution apparatus and method.

BACKGROUND

As semiconductor chip die size and complexity increases, the yield ratio, or number of usable die per wafer, tends to decrease. One reason for a decreased yield ratio is the accumulation of defects during fabrication. Not all defects will cause a particular die to become unusable, but defects within a memory circuit, for example, usually result in an unusable die since the memory may not faithfully reproduce the stored data. Typically, the only solution is to discard the defective die, which has a negative impact on the yield ratio.

Commonly, a memory structure may be located on a die and included as an instruction lookup, a temporary storage space, a data translation table, or some other data source for use on the die. Defects within a memory structure can cause the entire die to become unusable. Further, after the die is packaged into a chip carrier, a portion of a memory circuit may fail at a later time, manifesting a similar problem. In this case, the cost of packaging and testing will also be lost if the packaged die is later discarded due to a subsequent failure or previously undiscovered defects.

Accordingly, there is a need in the art for an apparatus and method to increase die usability and die yield for a die or packaged device including a memory device with a defect or failure manifested as a difference between an expected read value versus an actual read value from the memory device.

SUMMARY

Memory apparatuses and methods are disclosed herein to provide a redundant memory data substitution for main memory data under certain conditions. For example, in accordance with one aspect of the present invention, a memory apparatus includes a main memory, a redundant memory, and a substitution control unit. The main memory is configured to receive a read address and output a main data word comprising a plurality of main data sub-words where the read address includes a first portion and a second portion. The redundant memory is configured to receive the read address first portion and output a redundant data sub-word. The substitution control unit includes a substitution control word memory configured to store a plurality of substitution control words and configured to receive the read address first portion and assert a substitution control word including a substitution address second portion. The read address first portion and substitution address second portion form a substitution address. The substitution control unit asserts a substitution control signal when there is a match between the read address and the substitution address.

In accordance with another aspect of the present invention, an apparatus includes a main memory, a redundant memory, a substitution control word memory, a substitution control unit, and a substitution output unit. The main memory is configured to receive a read address and output a main data word comprising a plurality of main data sub-words where the read address has a first portion and a second portion. The read address has a first portion and a second portion. The redundant memory is configured to receive the read address first portion and output a redundant data word. The substitution control word memory is configured to receive the read address first portion and output a substitution control word. The substitution control word includes a substitution address second portion and a substitution sub-word identifier. The substitution address second portion and the read address first portion comprise a substitution address. The substitution sub-word identifier indicates one of the main data sub-words for substitution by the redundant data sub-word. The substitution control unit is configured to receive the read address and assert a substitution control signal when there is a match between the read address and the substitution address. The substitution output unit is configured to receive the plurality of main data sub-words, the redundant data sub-word, and the substitution control signal and assert an output data word comprising the plurality of main memory data sub-words with the redundant data sub-word substituted for the main data sub-word indicated by the substitution control word sub-word identifier.

In accordance with yet another aspect of the present invention, a method includes an operation for reading a main memory at a read address that has a first portion and a second portion to produce a main memory data word, an operation for reading a redundant memory at the read address first portion to produce a redundant memory data sub-word, and an operation for reading a substitution control word memory at the read address first portion to produce a substitution control word that has a substitution address second portion and a substitution sub-word identifier that together form a substitution address. The method further includes an operation for comparing the read address to the substitution address in order to determine a match, an operation for substituting the redundant data sub-word for the main data sub-word indicated by the substitution control word identifier, and an operation for producing an output data word comprising the redundant data sub-word substituted for a predetermined one of the main data sub-words.

The scope of the invention is defined by the claims. A more complete understanding of embodiments of the present invention will be afforded to those skilled in the art, as well as a realization of additional advantages thereof, by a consideration of the following detailed description of a plurality of more embodiments.

BRIEF DESCRIPTION OF THE DRAWINGS

Use of the same reference symbols in different figures indicates similar or identical items. Embodiments of the present invention and their advantages will be best understood by referring to the detailed description that follows.

DETAILED DESCRIPTION

The present invention, as defined in the claims, provides a memory apparatus and method that substitutes redundant memory data for main memory data during a read operation of the memory apparatus in response to a defect in the main memory. Thus, a defect in the main memory does not render the entire main memory unusable since the defective area of the main memory may be effectively masked with the redundant data.

Figure 1:
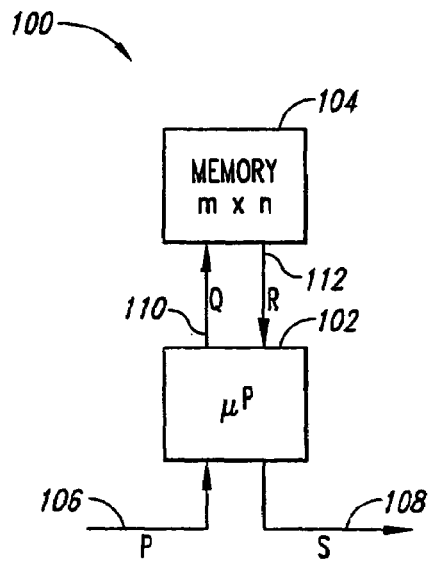
FIG. 1 shows a block diagram of a simple prior art data processing system.

FIG. 1 shows a block diagram of a simple prior art data processing system 100 which includes a microprocessor unit 102, a conventional memory unit 104, an input data bus 106, and an output data bus 108. Microprocessor unit 102 reads the contents of memory unit 104 by asserting a memory address on a memory address bus 110 and receives a data output word on a memory data bus 112. Microprocessor 102 then performs a computation or an operation using the read data output word. In a sample operation, microprocessor 102 receives a data word P over the input data bus 106. Microprocessor 102 asserts a memory address word Q to memory unit 104 which then supplies the contents of the memory unit 104 at the address Q over bus 112. The source of address word Q can be from a program executing on microprocessor 102, or address word Q can be previously input from a user. Upon receiving address word Q on address bus 110, memory 104 then provides the contents of the memory R at the processor asserted address Q onto memory output data bus 112. Data word R corresponds to the information stored in memory 104 at address Q and corresponds to a read of memory 104 at the desired address Q.

Microprocessor 102 can perform a computation, such as addition, where S=P+R, and S is asserted as an output word on processor output data bus 108. A person of ordinary skill in the art will recognize that there are many possible operations based on the described capabilities of data processing system 100. Memory 104 may include a Read Only Memory (ROM), a Random Access Memory (RAM), a Non-Volatile Memory (NVM), or a logic circuit such as a Programmable Logic Device (PLD) that implements the same or similar functions. Some examples of ROM type memories are Laser-Fuse structures, mask programmable ROM, Flash Erasable Memory, Electronically Programmable ROM (EPROM), and Electronically Erasable Programmable ROM (EEPROM).

Memory 104 can contain and represent data in the form of binary digits (bits) that are organized into a predetermined number of memory words where each memory word includes a predetermined number of bits. The size, or capacity of the memory, can be referenced in terms of p-words and q-bits/word and configured as an m_×_n sized memory having m-rows and n-columns, where m, n, p and q are selected integers. For example, a memory having a capacity of 16384-bits may be configured as 32-rows and 512-columns, where each cross point corresponds to a single bit for a total of 16384 bits. As a result, there are 512 bits on each row and 32 bits on each column. When using binary numbers of a substantial size, it is convenient to use a base-two unit of K, where K=2^10=1024. In the example just given, the 512 columns may be organized in eight column groups. As a result, the memory array may be configured as 32 rows with 512 bits on each row organized as 64×8 bits or 64 words for a total of 2 K-words, each word having 8-bits. In another example, a memory having a capacity of 512 K-bits may be organized into 16 K-words each having 32-bits, so the memory may be referred to as a 16 K×32 memory.

Figure 2:
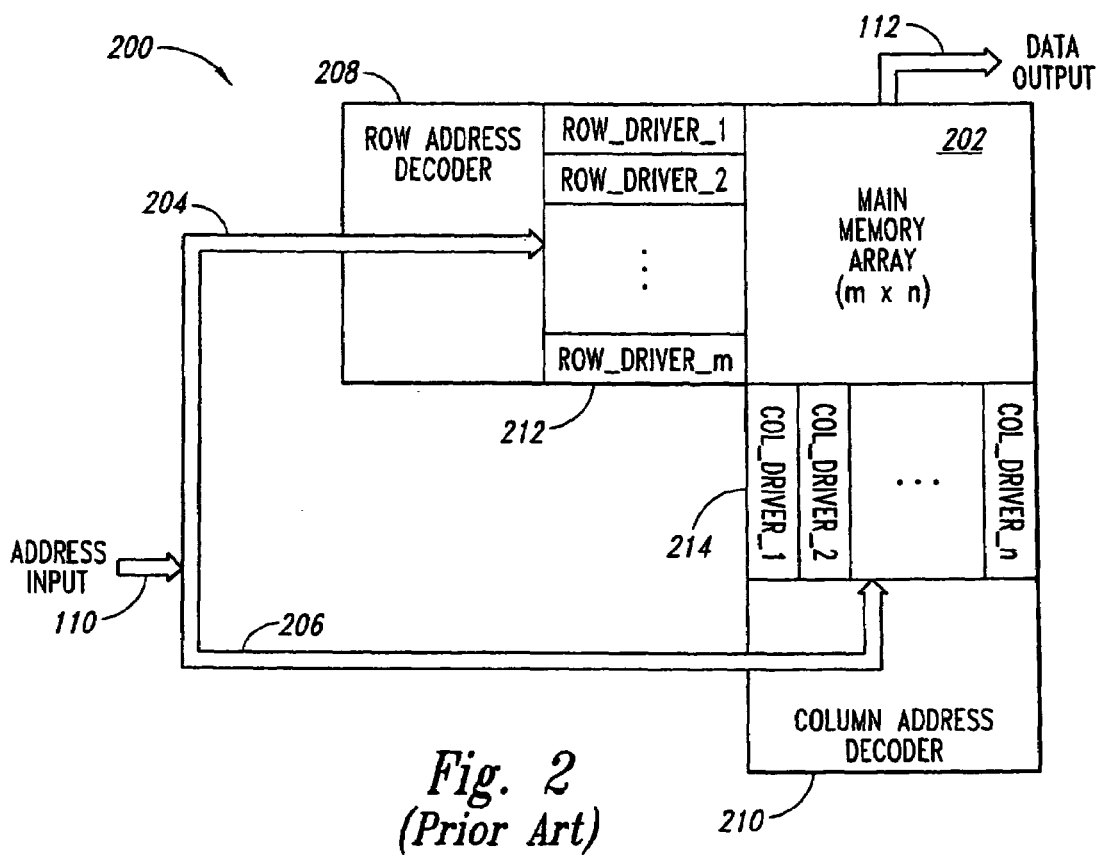
FIG. 2 shows a block diagram of a conventional memory unit.

FIG. 2 shows a block diagram of a conventional memory unit 200 that may be substituted for memory unit 104 in data processing system 100. Conventional memory unit 200 includes an m-row by n-column main memory array 202. Memory unit 200 receives an input address over address bus 110 where the address is divided into a row address provided over row address bus 204 and a column address provided over column address bus 206. Typically, such a division is done based on upper and lower bits where the upper bits of the address provided over bus 110 are designated the row address provided over row address bus 204, while the lower bits of the address via bus 110 are designated the column address provided over column address bus 206. Memory unit 200 further includes a row address decoder 208 and a column address decoder 210. Row address decoder 208 receives the row address over row address bus 204 and typically activates one of a plurality of row drivers 212 to enable reading of the addressed row of memory array 202. Similarly, column address decoder 210 receives the column address over column address bus 206 and activates one of a plurality of column drivers 214 to enable reading of the addressed column of memory array 202. When both the addressed row and the addressed column of the memory array 202 are enabled for reading, the data word comprising the memory contents corresponding to the addressed row and column will be asserted as an output data word and driven through an output structure (not shown) to become output data on output data bus 112.

Figure 3:
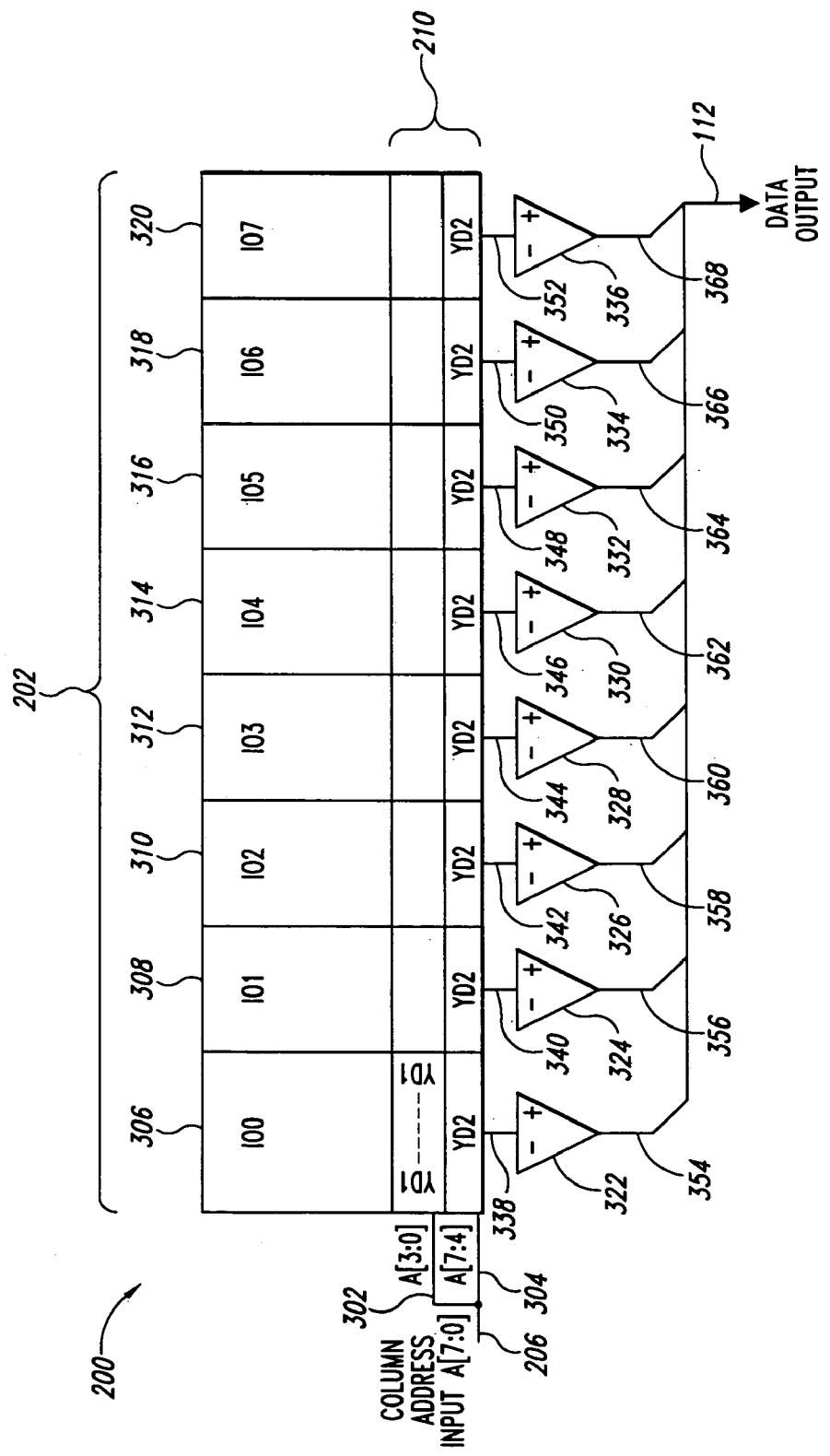
FIG. 3 shows another view of a conventional memory unit where a column address is further divided into a lower column address and an upper column address.

FIG. 3 shows another view of a conventional memory unit 200 where a column address is provided over column address bus 206 and is further divided into a lower column address over bus 302 and an upper column address over bus 304. Memory array 202 is also divided into a plurality of column groups, IO[0:7], (306–320) where each column group drives the output of an associated column output driver (322–336) based on the column address word asserted on column address bus 302. Similarly, the row address word asserted on row address bus 304 drives the output of an associated column within the plurality of column groups (306–320) so that a particular row and column entry for each column group is selected for reading. Typically, a column output driver 322 can be implemented as a plurality of sense amplifiers that receive a relatively weak array output signal via line or bus 338 from the memory array during reading and output a much stronger driven output signal via line or bus 354 that is then asserted onto the output data bus 112. Each array output signal 338–352 comprises a plurality of signals in parallel to form a bus where the output of each column group 306–320 comprises a column word, in this example having a width of 8-bits. The output signals (354–368) for each of the column output drivers 322–336 are concatenated into an output data word that is asserted on output data bus 112.

Figure 4:
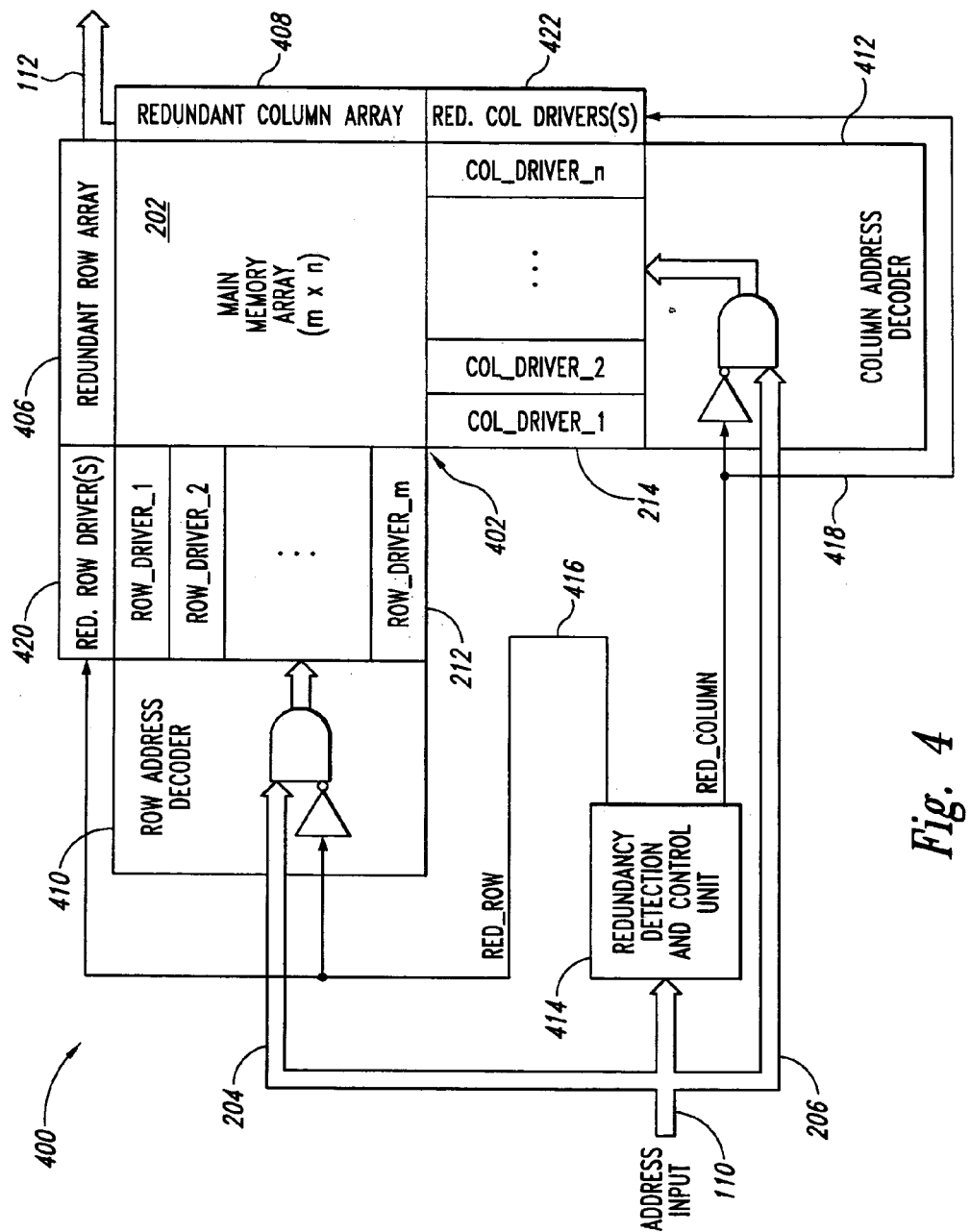
FIG. 4 shows a memory unit according to a first embodiment of the present invention.

FIG. 4 shows a memory unit 400 according to a first embodiment of the present invention that may be used as memory unit 104 in data processing system 100. As described in reference to FIG. 2, memory unit 400 includes a memory array 402 with an m_×_n main memory array 202 having a size of m-rows and n-columns. Memory unit 400 further includes redundant memory having a redundant row array 406 and a redundant column array 408 which together with memory array 202 are collectively referred to as memory array 402. Redundant row array 406 includes n-columns, while redundant column array 408 includes m-rows. Alternatively, memory array 402 can include main memory array 202 and either redundant row array 406 or redundant column array 408. In this manner, memory array 402 contains more bits and is larger than main memory array 202 of the same stated size of m-rows and n-columns. Main memory array 202, redundant row array 406, and redundant column array 408 may be fabricated together as a single array that is partitioned into logically separate arrays. Alternatively, redundant row array 406, redundant column array 408, and main memory array 202 may each be constructed as stand-alone arrays. In the description of a communications channel, the terminology of a signal line or bus may be used interchangeably to denote a single communication path composed of one or more signal carriers, like wires.

Memory unit 400 receives an input address over address bus 110 that is divided into a row address provided over row address bus 204 and a column address provided over column address bus 206. A row address decoder 410 receives the row address information over row address bus 204 and activates one of a plurality of row drivers 212 to enable reading of the addressed row of main memory 202. Similarly, a column address decoder 412 receives column address information over column address bus 206 and activates one of a plurality of column drivers 214 to enable reading of the addressed column of main memory 202. When both the addressed row and the addressed column of the memory array 202 are enabled for reading, memory contents corresponding to the addressed row and column will be asserted as an output data word on output data bus 112.

Memory unit 400 includes a redundancy detection and control unit (RDU) 414 which receives addresses provided over address bus 110 corresponding to redundant rows and redundant columns in the memory array 402. RDU 414 receives an address word asserted on address bus 110 and asserts a redundant row (Red_Row) signal over line 416 when the row address 204 corresponds to a previously identified row address in main memory 202 which requires data substitution. Similarly, RDU 414 receives address 110 and asserts a redundant column (Red_Column) signal over line 418 when the column address on column address bus 206 corresponds to a previously identified column address in main memory 202 which requires data substitution. In one embodiment, when Red_Row signal over line 416 is asserted, one of a plurality of redundant row drivers 420 is activated to enable reading of the addressed row of redundant row array 406 while a portion of row address decoder 410 for main memory 202 is effectively disabled. Similarly, when Red_Column signal 418 is asserted, one of a plurality of redundant column drivers 422 is activated to enable reading of the addressed column of redundant column array 408 while a portion of column address decoder 412 is effectively disabled. In this manner, the reading of a redundant row or redundant column will not conflict with the reading of the corresponding main memory 202 row or column.

Figure 5:
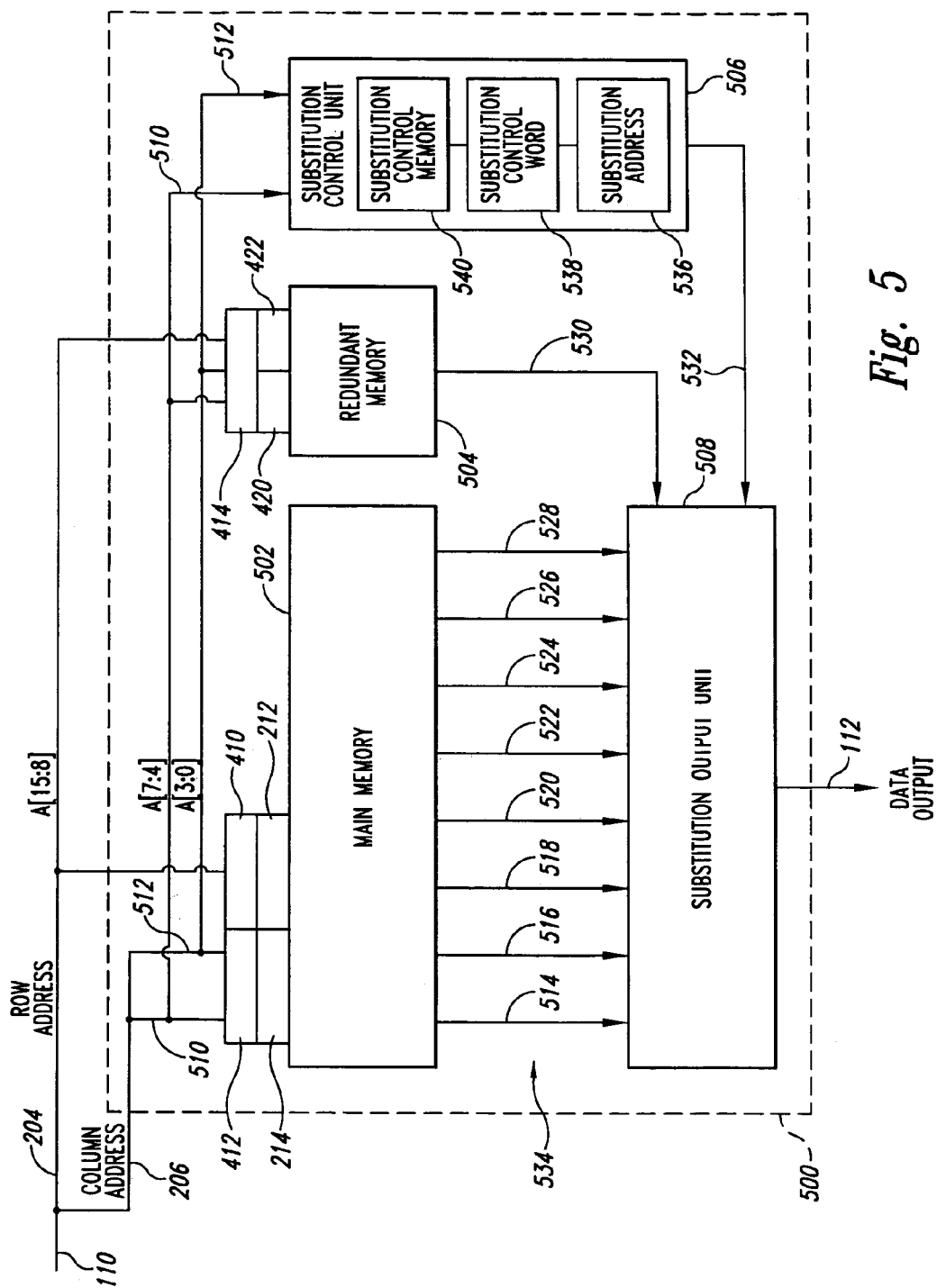
FIG. 5 shows a memory unit according to a second embodiment of the present invention.

FIG. 5 shows a memory unit 500 according to a second embodiment of the present invention that may be used as memory unit 104 in data processing system 100. Memory unit 500 includes a main memory 502, a redundant memory 504, a substitution control unit 506, and a substitution output unit 508. Memory unit 500 receives an address via bus 110 lower portion 206 that is composed of two parts, an upper address provided by bus 510, and a lower address provided by bus 512. For example, if the address provided via bus 206 includes eight bits of data and is denoted A[7:0], the upper address bus provided by bus 510 corresponds to the Most Significant Bits (MSBs) A[7:4] while the lower address provided by bus 512 corresponds to the Least Significant Bits (LSBs) A[3:0]. An upper address word on upper address bus 510 is applied to both the main memory 502 and substitution control unit 506, while a lower address word on lower address bus 512 is applied to main memory 502, redundant memory 504, and substitution control unit 506. In this disclosure, address and data widths are exemplary in nature and may consist of a fewer or a greater number of bits than what is shown in the various embodiments. Similarly, although address A[7:0] is shown as evenly divided between bus 510 and 512, this is not considered limiting.

Main memory 502 receives an address via bus 206 and produces a memory data word 534 comprising a plurality of main memory data sub-word outputs provided via busses 514–528. Memory data word 534 is the data output of main memory 502 at the address applied on bus 206. Redundant memory 504 receives the lower address via bus 512 and generates a redundant memory data word on a redundant data output bus 530 that corresponds to the data output of redundant memory 504 at the lower address on bus 512. In this example, the data width of redundant data output 530, meaning the number of output data bits, is equal to each of the main memory data sub-word outputs on busses 514–528. Substitution control unit 506 receives the upper address via bus 510 and the lower address via bus 512 and generates a substitution control signal on bus 532 if the address word provided on column address bus 206 matches a substitution address on bus 536 which is derived from a substitution control word on bus 538, including a substitution address second portion (A'[7:4] as shown in FIG. 6) that is indexed by the portion of the address word asserted on lower address bus 512.

The substitution address is determined prior to reading main memory 502 and is based upon detection of a problem that prevents the proper reading of the data word stored at the substitution address in main memory 502. A problem that prevents the proper reading of data stored in main memory 502 can be, for example, a manufacturing defect that is detected using a write and read-back operation on main memory 502. If unique data is written to a suspected bad address in main memory 502, but the unique data cannot be read back from the suspected bad address properly so that a portion of the output data word is not as expected, the suspected bad address as well as an identification of the portion of the output data word can be recorded in an entry within a substitution control memory 540. The suspected bad address entry identifies both the row address and a columnar portion of the output data word that must be substituted. Substitution control word 538 is used to construct the substitution address and is read from substitution control memory 540. In this manner, the substitution address second portion and lower address on bus 512 comprise a substitution address.

The substitution control signal provided over line 532 enables the substitution of data output from redundant memory 504 in the place of a portion of the data output from main memory 502. In one example, if the address word asserted on column address bus 206 corresponds to a main memory address requiring substitution of a main memory sub-word provided over output 518, substitution output unit 508 will assert an output data word on output data bus 112 forming the data word output from a concatenation of output sub-words asserted on main memory data sub-word busses 514–516, redundant memory sub-word output bus 530, and main memory data sub-word busses 520–528. In this example, the output of redundant memory 504 on bus 530 is substituted for the output of main memory on sub-word bus 518. In another example, if the address word asserted on column address bus 206 corresponds to an address requiring substitution of main memory sub-word output on bus 528, then substitution output unit 508 will assert an output data word on output data bus 112 comprising a concatenation of output sub-words from main memory sub-word busses 514–526 and redundant memory sub-word bus 530. In this example, the output of redundant memory 504 on bus 530 is substituted for the output of main memory sub-word on bus 528. Substitution signal on control line 532 determines which sub-word from among the plurality of main memory data sub-words output busses (514–528) is substituted in the data output by redundant memory sub-word output 530 on output data bus 112.

Figure 6:
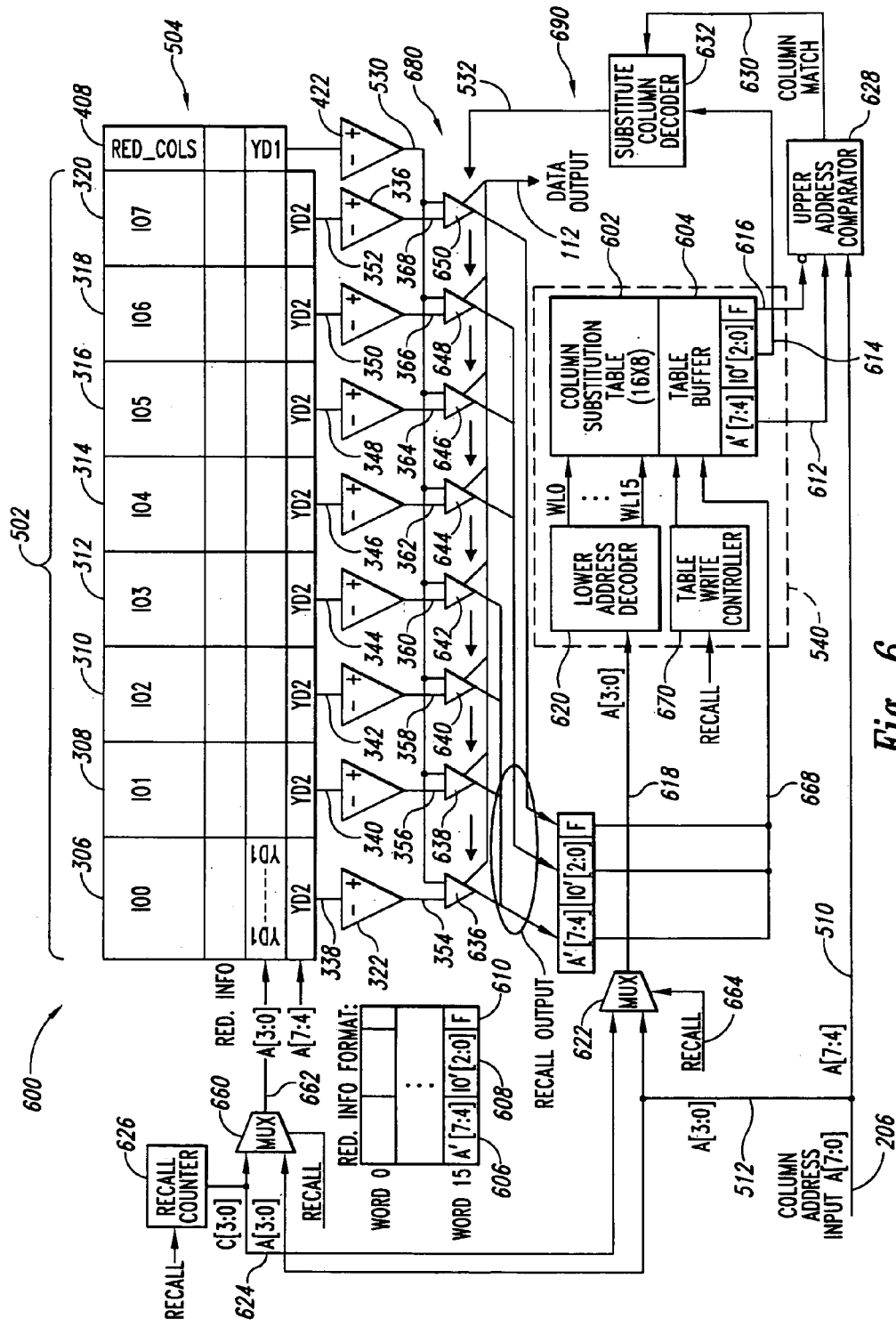
FIG. 6 shows a memory unit according to a third embodiment of the present invention including only a redundant column array as a redundant memory.

FIG. 6 shows a memory unit 600 according to a third embodiment of the present invention. This embodiment includes only a redundant column array 408 which provides the functionality of redundant memory 504. A column substitution table 602 stores data identifying particular column addresses in main memory 502 that will be replaced by the substitution information during reading of predetermined rows of memory unit 600. Column substitution table 602 further includes a column table buffer section 604 for outputting the stored substitution information.

Column substitution table 602 stores substitution information for use in the column address decode operation where a decoded column address matching a substitution address derived from an entry in column substitution table 602 requires a substitution of data from redundant column array 408 into a predetermined portion of output data bus 112 of memory unit 600. Column substitution table 602 can be implemented as a random access memory (RAM), a register file, or random logic for storing table information. In one embodiment, column substitution table 602 is implemented as a 16-word by 8-bit (16×8) static random access memory (SRAM) which can be loaded from main memory 502 following a power-on condition. Column substitution table 602 stores the substitution control word according to a redundant information format which includes a substitution address second portion 606, a sub-word identifier 608, and a substitution required flag F 610. The sub-word identifier 608 provides for the substitution of redundant output data for one of a plurality of columns (306–320) in main memory array 502.

During a read of main memory 502 a lower column address 512 is used to access the contents of column substitution table 602 which outputs a word of redundant information stored within table 602 through a table buffer section 604. This word of redundant information asserted by table buffer section 604 includes a substitution address second portion value over bus 612 corresponding to an upper column address of a substitution address, a sub-word identifier value over bus 614 corresponding to a column within main array 502 needing substitution, and a substitution required flag value over line 616. The sub-word identifier value provided over bus 614 indicates the one column from among the many main memory columns for data substitution. The substitution required flag value over line 616 indicates when the substitution is required. If the value of the substitution required flag over line 616 is low, then the substitution required is valid or true. Otherwise, the substitution is invalid or false, and will not take place, even when both the substitution address second portion over bus 612 and the sub-word identifier over bus 614 are valid. In this embodiment, a lower address decoder 620 translates a lower address value over bus 618 into a row select WL0–WL15 for accessing column substitution table 602. A first initialization multiplexer 622 selects between the lower column address A[3:0] over bus 512 and a recall counter value C[3:0] over bus 624 that is generated by a recall counter 626. The output of first multiplexer 622 is a lower address value A[3:0] over bus 618 which is asserted to lower address decoder 620.

The upper column address value over bus 612, the upper column address over bus 510, and the substitution required flag value over line 616 are asserted to an upper address comparator 628 in order to determine if a column match is valid. If upper column address value 612 matches the upper column address 510 and the substitution required flag value 616 is true (active low), then a match is found indicating a column of data must be substituted, and upper address comparator 628 asserts a column match signal 630 true. Sub-word identifier value 614 and the column match signal 630 are asserted to a substitute column decoder 632 that asserts a substitute column signal 532 which determines which main array memory column output will be switched in order to output the substituted data from the redundant column array 408. Using main memory array 502 column IO0 306 as an example, assuming column match signal over line 630 is asserted true, if the substitute column signal over bus 532 indicates column IO0 306 is required for substitution, then an output multiplexer 636 that receives the main memory 502 sub-word output via bus 354 will instead select the redundant array word on output bus 530 to assert onto that portion of output data bus 112 corresponding to column IO0 306. The data words asserted on the sub-word output busses (338–352) will be asserted onto output data bus 112 except for the data corresponding to the column identified as requiring substitution. In this case, the data output of the redundant array 408 will be asserted instead. Output multiplexers 636–650 comprise a substitution output unit 680 that receives the main data sub-word output busses (354–368), the redundant data sub-word output bus 530, and the substitution control signal over bus 532 to select which sub-word output the redundant data sub-word output will replace.

In this embodiment, column substitution table 602, lower address decoder 620, first multiplexer 622, recall counter 626, upper address comparator 628, substitute column decoder 632, second initialization multiplexer 660, and table write controller 670 are collectively referred to as a substitution control unit 690 (SCU). Other embodiments of substitution control unit 690 are possible and can include the integration of these and other components. Second initialization multiplexer 660 selects between the counter value via bus 624 and the lower column address via bus 512 to produce an initialization lower column address signal A[3:0] provided on bus 662. Although shown separately, multiplexer 622 and multiplexer 660 may be a single multiplexer. Following a power-on condition, power is applied to memory 600 which can then enter an initialization (recall) mode. When the substitution control unit 690 is in the initialization mode, a recall signal line 664 is asserted true that activates both first multiplexer 622, second multiplexer 660, recall counter 626, and table write controller 670. During initialization mode, recall counter 626 sequences through all of the lower column addresses in order to access the data stored in predetermined regions of main memory array 502 that are reserved to hold the redundant information stored in each column (306–320). This redundant information data is asserted onto a recall output bus 668 used to communicate the redundant information data for storage in the column substitution table 602. Redundant column substitution for main memory column data can be applied with unlimited memory density and unlimited redundancy columns.

As described, substitution control unit 690 has two modes of operation: substitution and initialization. In the initialization (recall) mode, stored information regarding substitutions is recalled, or loaded, into the column substitution table 602, usually following a power-on condition. Alternatively, this initialization mode may be entered following a user command, or as a part of periodic system diagnostic sequence. This substitution information can reside within main memory 502, another memory within memory 600, or may be stored in a location external to memory 600 and accessed when initialization of the substitution control unit 690 is needed following a power-on or other condition. This column redundancy scheme herein described can also be used for row redundancy in a memory system. In this latter case, a redundant row array memory produces a redundant row data word comprising a plurality of redundant row data sub-words that can substitute for an entire main memory row data output when the read address on address bus 110 matches a substitution address. Both row redundancy and column redundancy may be implemented in the same memory unit having both a redundant row memory and a redundant column memory. In this case, the substitution control word memory format will be different since the redundant row memory data is substituted for the entire main memory data word when the read address on address bus 110 matches the substitution address.

Figure 7:
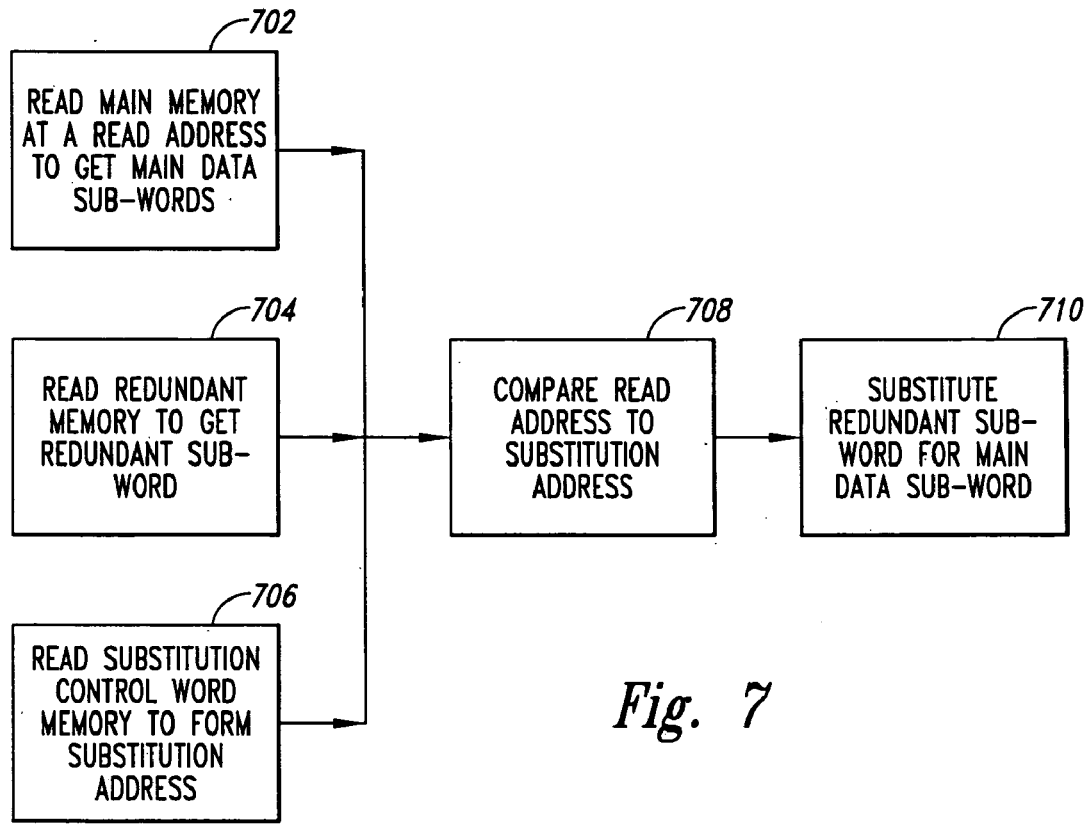
FIG. 7 shows a flow diagram describing a method of substituting data according to an embodiment of the present invention.

FIG. 7 shows a flow diagram describing a method of substituting data according to an embodiment of the present invention. In reference to FIGS. 5–7, the method of substituting data includes an operation 702 for reading main memory 502 at a read address to produce main memory data word asserted on main memory output bus 534, an operation 704 for reading a redundant memory 504 to produce a redundant memory data sub-word at bus 530, and an operation 706 for reading substitution control word memory 540 to produce a control word at bus 538 including a substitution address 536. The main memory 502 is read at a column address word asserted on column address bus 206. The substitution control memory 540 is read using the lower portion of address A[7:0] denoted as A[3:0] asserted on bus 512 corresponding to a column read address on bus 206. Reading substitution control memory 540 produces substitution control word 538 that includes a substitution address second portion 606 corresponding to a predetermined upper address portion A[7:4] on bus 510 of the column read address on bus 206. The substitution control word 538 further includes a sub-word identifier 608 that indicates the portion of the main memory data word for which the redundant memory data sub-word on bus 530 will substitute. In this manner, substitution address second portion 606 and the lower portion of read address on bus 206 comprise a substitution address. The method further includes an operation 708 for comparing the column read address 206 to a substitution address to determine a match, and an operation 710 for substituting the redundant data sub-word output for the portion of the main memory output data indicated by the substitution control word identifier.

Figure 8:
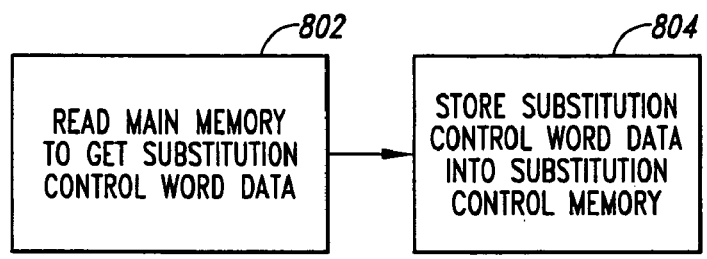
FIG. 8 shows a flow diagram describing a method of substituting data according to an embodiment of the present invention including initialization of a substitution control word memory.

FIG. 8 shows a flow diagram describing a method of substituting data including initialization of substitution control word memory. In reference to FIGS. 5–8, initialization of substitution control word memory 540 includes an operation to read main memory 502 to produce substitution control word data, and an operation 804 to store the produced substitution control word data into substitution control word memory 540. Alternatively, substitution control word memory 540 may be initialized using data external to main memory 502, or may be permanently programmed in the case where the output from a redundant ROM substitutes for an output of a larger, main memory ROM apparatus.

Although the invention has been described with respect to particular embodiments, this description is only an example of the invention's application and should not be taken as a limitation. It should also be understood that numerous modifications and variations are possible in accordance with the principles of the present invention. Accordingly, the scope of the invention is defined only by the following claims.

We claim:

1. A memory apparatus, comprising:
a main memory configured to receive a read address and output a main data word comprising a plurality of main data sub-words, the read address including a first portion and a second portion;
a redundant memory configured to receive the read address first portion and output a redundant data sub-word; and
a substitution control unit including a substitution control word memory configured to store a plurality of substitution control words, the substitution control word memory being configured to receive the read address first portion and assert a substitution control word including a substitution address second portion, the read address first portion and substitution address second portion forming a substitution address, the substitution control unit being configured to receive the read address and assert a substitution control signal when there is a match between the read address and the substitution address.

2. The memory apparatus of claim 1, further comprising:
a substitution output unit configured to receive the plurality of main data sub-words, the redundant data sub-word, and the substitution control signal, the substitution output unit being configured to assert an output data word including all but a predetermined one of the plurality of main data sub-words with the redundant data sub-word substituted for the predetermined one of the plurality of main data sub-words.

3. The memory apparatus of claim 2, wherein the substitution control word includes a sub-word identifier indicating the predetermined one of the plurality of main data sub-words for substitution.

4. The memory apparatus of claim 2,
wherein the redundant memory comprises a column array memory adapted to store a redundant column data sub-word.

5. The memory apparatus of claim 4,
wherein the substitution control signal indicates the substitution of the redundant column data sub-word for a predetermined main data sub-word.

6. The memory apparatus of claim 5, further comprising:
a second redundant memory comprising a redundant row array memory configured to receive the read address and output a redundant row data word comprising a plurality of redundant row data sub-words, the number of redundant row data sub-words being equal to the number of main data sub-words; and
a second substitution control unit configured to receive the read address and assert a row substitution control signal when there is a match between the read address and a predetermined row substitution address, the row substitution control signal indicating the substitution of the redundant row data sub-words for the main data sub-words.

7. The memory apparatus of claim 1,
wherein the redundant memory unit comprises a redundant row array memory configured to receive the read address and produce a redundant row data word comprising a plurality of redundant row data sub-words, the number of redundant row data sub-words being equal to the number of main data sub-words.

8. The memory apparatus of claim 7, further comprising:
a substitution output unit configured to receive the plurality of main data sub-words, the plurality of redundant row data sub-words, and the substitution control signal, the substitution output unit being configured to assert an output data word comprising only the plurality of redundant row data sub-words.

9. A memory apparatus, comprising:
a main memory configured to receive a read address and output a main data word comprising a plurality of main data sub-words, the read address having a first portion and a second portion;
a redundant memory configured to receive the read address first portion and output a redundant data word;
a substitution control word memory configured to receive the read address first portion and output a substitution control word, the substitution control word including a substitution address second portion and a substitution sub-word identifier, the substitution address second portion and the read address first portion comprising a substitution address, the substitution sub-word identifier indicating one of the plurality of main data sub-words for substitution by the redundant data sub-word;
a substitution control unit configured to receive the read address and assert a substitution control signal when there is a match between the read address and the substitution address; and
a substitution output unit configured to receive the plurality of main data sub-words, the redundant data sub-word, and the substitution control signal; the substitution output unit configured to assert an output data word comprising the plurality of main memory data sub-words with the redundant data sub-word substituted for the main data sub-word indicated by the substitution control word sub-word identifier to produce an output data word.

10. The memory apparatus of claim 9, wherein the control word memory comprises a column substitution table and the substitution control unit further comprises:
means for decoding read address first portion to read an entry in the column substitution table.

11. The memory apparatus of claim 10, wherein the substitution control unit further comprises:
means for writing control word data into the control word memory during an initialization mode.

12. The memory apparatus of claim 9, wherein the substitution control word comprises:
a substitution required flag for indicating when the substitution at the substitution address is required, the substitution required having a value of one of true and false, the substitution of redundant data for main data occurring only when the substitution required flag has the value of true.

13. The memory apparatus of claim 9,
wherein the substitution control word data is initially stored outside the memory apparatus, and wherein the substitution control word memory is loaded with the substitution control word data from outside the memory apparatus during an initialization operation where substitution control word data stored outside the memory apparatus is loaded into the substitution control word memory.

14. The memory apparatus of claim 9,
wherein the substitution control word data is initially stored within the main memory,
wherein the substitution control word memory is loaded with the substitution control word data from the main memory during an initialization operation where substitution control word data stored in the main memory is loaded into the substitution control word memory.

15. A method, comprising:
reading a main memory at a read address to produce a main data word comprising a plurality of main data sub-words, the read address having a first portion and a second portion;
reading a redundant memory at the read address first portion to produce a redundant data sub-word;
reading a substitution control word memory at the read address first portion to produce a substitution control word having a substitution address second portion and a substitution sub-word identifier, the substitution address second portion and the read address first portion together comprising a substitution address;
comparing the read address to the substitution address to determine a match;
substituting the redundant data sub-word for the main data sub-word indicated by the substitution control word sub-word identifier to produce an output data word when the substitution address matches the read address; and
producing an output data word comprising the redundant data sub-word substituted for a predetermined one of the main data sub-words.

16. The method of claim 15, wherein the redundant memory comprises a redundant column array memory adapted to produce a redundant data sub-word.

17. The method of claim 15,
wherein the redundant memory comprises a redundant row array memory, the redundant row array memory for producing a plurality of redundant data sub-words, the number of redundant data sub-words being equal to the number of main data sub-words.

18. The method of claim 17, further comprising:
substituting the plurality of redundant data sub-words for the plurality of main data sub-words to produce an output data word when the substitution address and the read address match.

19. The method of claim 15, further comprising:
reading the contents of the main memory to extract substitution control word data; and
storing the control word data into a substitution control word memory.

20. The method of claim 19, wherein reading the contents of the main memory further comprises:
supplying a counter value as an initialization address to the main memory and the substitution control word memory, the counter value corresponding to the read address first portion;
reading the main memory at the initialization address to produce a main data word; and
writing a predetermined portion of the main data word to the substitution control word memory.

* * * * *